US 6,734,749 B2

(12) United States Patent
Mattisson et al.

(10) Patent No.: US 6,734,749 B2
(45) Date of Patent: May 11, 2004

(54) DIRECT MODULATED PHASE-LOCKED LOOP

(75) Inventors: Sven Mattisson, Bjarred (SE); Håkan Eriksson, Lund (SE)

(73) Assignee: Telefonaktiebolaget LM Ericsson (Publ) (SE)

( * ) Notice: Subject to any disclaimer, the term of this patent is extended or adjusted under 35 U.S.C. 154(b) by 271 days.

(21) Appl. No.: 09/867,921

(22) Filed: May 29, 2001

(65) Prior Publication Data
US 2002/0180548 A1 Dec. 5, 2002

(51) Int. Cl.[7] .................................................. H03C 3/00
(52) U.S. Cl. ........................ 332/127; 332/128; 331/16; 327/156
(58) Field of Search .......................... 331/1 A, 14, 16, 331/17, 23, 25; 332/127, 128; 327/105–107, 156–159

(56) References Cited

U.S. PATENT DOCUMENTS

| 4,573,026 A | | 2/1986 | Curtis et al. ................ 332/18 |
| 4,994,768 A | | 2/1991 | Shepherd et al. ........... 332/127 |
| 5,483,203 A | | 1/1996 | Rottinghaus ................ 331/10 |
| 5,576,666 A | | 11/1996 | Rauvola ..................... 331/25 |
| 5,729,182 A | * | 3/1998 | Fousset et al. ............. 331/17 |
| 5,834,987 A | * | 11/1998 | Dent ......................... 327/105 |
| 5,960,364 A | * | 9/1999 | Dent ......................... 455/12.1 |
| 6,211,747 B1 | * | 4/2001 | Trichet et al. ............. 332/128 |

FOREIGN PATENT DOCUMENTS

| EP | 0 322 139 B1 | 12/1988 |
| EP | 0 408 238 A2 | 1/1991 |
| GB | 2 228 840 A | 9/1990 |
| GB | 2 317 512 | 3/1998 |
| GB | 2 354 649 A | 3/2001 |

OTHER PUBLICATIONS

EPO Standard Search Report, RS 107126 US, dated Feb. 6, 2002.
Japanese Patent Document No. 55–30273, "PLL Synthesizer", Mar. 4, 1980.
Japanese Patent Document No. 1–126023, Radio Equipment for Simultaneous Transmission and Reception Communication, May 18, 1989.
ISR PCT/EP 02/05248; Dated Sep. 2, 2002.

* cited by examiner

Primary Examiner—Robert Pascal
Assistant Examiner—Kimberly E Glenn
(74) Attorney, Agent, or Firm—Jenkens & Gilchrist

(57) ABSTRACT

Direct frequency modulation of a phase-locked loop (PLL) output signal is achieved by means of a modulation signal comprising a digital sequence. The digital modulation signal is coupled to the input of the VCO of the PLL, and is also coupled to drive an up-down counter. The output of the counter is coupled to a D/A converter to provide a compensation signal for the PLL. When the counter output reaches values representing modulation-induced phase errors of +360 degrees and −360 degrees, the counter generates signals respectively corresponding thereto to adjust the PLL frequency divider.

26 Claims, 2 Drawing Sheets

DIRECT MODULATED PHASE-LOCKED LOOP

BACKGROUND OF THE INVENTION

The invention disclosed and claimed herein generally pertains to an apparatus and method for achieving direct frequency modulation of an output signal generated by a phase-locked loop (PLL) circuit. More particularly, the invention pertains to apparatus and method of the above type wherein the modulation signal comprises a digital sequence. Even more particularly, the invention pertains to apparatus and method of the above type wherein a counter is employed to selectively adjust the frequency divider of the PLL, in order to limit phase error signal levels.

Direct modulation of a voltage controlled oscillator (VCO) is very attractive since it simplifies the radio transmitter design, and thus may lower cost and power consumption. By changing the VCO input or control signal, a radio frequency (RF) carrier may be modulated, for example, to accomplish FM modulation. Typically, the VCO output frequency is proportional, although in a weakly non-linear fashion, to the input control signal. Thus, FM modulation may be accomplished by letting the control signal be proportional to the base-band signal. RF frequency has, however, to be accurately positioned at the correct channel frequency, and this is generally not possible with the VCO control signal accuracy achievable in mass production.

In order to control the VCO center frequency, the VCO may be used in a phase-locked loop (PLL) circuit. As is well known in the art, the phase-locked loop includes a tunable oscillator, typically a VCO, whose output signal is locked to a known reference signal by means of a phase comparator. The phase comparator generates an output voltage or current that is proportional to the phase difference between the two signals. The phase comparator output is fed back to the input of the VCO, through a loop filter H(s), as the VCO control signal. This locks the VCO output signal to the reference frequency, which thereby sets the accuracy of the VCO output frequency. By interposing a divide-by-N-block in the PLL circuit, the reference frequency may instead be compared with the VCO frequency divided by N, whereby the VCO output will be locked to N times the reference frequency. Moreover, by providing a divider control to vary N, it is possible to generate frequencies which are the Nth harmonic of the reference frequency where N is an integer.

If the VCO is modulated by adding a modulation signal $V_{mod}$ to the VCO control signal, phase modulation of the PLL may be accomplished. With regard to frequency modulation, however, a PLL is in effect a control system that maintains a constant phase difference between two signals, so that any variations in the phase of one signal relative to the other are removed by the PLL. While this property of a PLL is useful in suppressing noise and cleaning up a signal, it also tends to suppress frequency modulation of a signal in a PLL circuit. Only if the modulation signal is fast compared to the looped filter, and the modulation signal has a zero mean, can the PLL act as an FM modulator. In the general case, however, this is not possible.

In view of these difficulties encountered in using a PLL for direct FM modulation, a technique has been developed wherein a compensation signal may be added to the phase detector error signal, such that the modulation signal component of the phase error is cancelled. This compensation signal may, however, grow quite large if the frequency deviation has a mean which is not close to zero. Furthermore, phase detector nonlinearities, such as the sinusoid response of a multiplying detector, have to be accounted for in an integrator constant K associated with operation of the VCO. These problems have generally prevented the widespread use of the compensation signal arrangement, which is known in the art as 2-point or 2-phase modulation of a PLL VCO.

SUMMARY OF THE INVENTION

In accordance with the invention, a modulation signal comprising a digital sequence is coupled to a bidirectional counter such as an up-down counter, to provide a compensation signal for the modulation-induced error. The compensation signal is then injected into the PLL from the counter output by means of a digital-to-analog (D/A) converter. The modulation component of the phase error signal will thereby be proportional to the counter output. When the counter output is a value corresponding to a modulation-induced error of 360 degrees, it sends a signal to the frequency divider control block of the PLL, whereupon the PLL divider is directed to divide the VCO output frequency by N+1 or N-1, rather than by N, depending on the sign of the error. This resets the error signal, and the counter is also reset. Thus, by exploiting the modulus 360 degree properties of the phase error, it is possible to limit the signal levels in the modulation compensation circuit used with the PLL.

By using analog modulation and digital compensation, the invention offers a less complex implementation resulting in reduced power consumption. The compensation employed in the 2-point modulation scheme of the invention is simple, and consists of an up-down counter and a D/A converter with a maximum output corresponding to a 360 degree phase error. Furthermore, simple direct FM modulation of a PLL can be accomplished at very high symbol rates, much higher than the reference frequency, with no limit to the FM burst length.

In one embodiment, the invention is directed to apparatus for selectively modulating the output signal of a VCO associated with a PLL circuit, which additionally comprises an adjustable frequency divider, a phase comparator, and a reference frequency source which determines the output signal frequency of the VCO. The apparatus comprises a counter coupled to receive a modulation signal comprising a train of digital symbols, the counter being driven by the modulation signal to produce an output corresponding thereto, the counter being further operated to generate a divider adjustment signal when the counter output reaches a specified value. The apparatus further comprises a first path for coupling a signal representing the digital modulation signal to the VCO input, a second path for injecting a compensation signal into the PLL for combination with the output of the phase comparator, and a divider control device for selectively adjusting the frequency divider in response to the adjustment signal.

In a preferred embodiment of the invention, the counter comprises an up-down counter and generates first and second adjustment signals when the counter produces first and second counter output values, respectively. The control device adjusts the divisor of the divider from N to N+1 and from N to N-1 in response to the first and second adjustment signals, respectively. The first and second counter output values respectively correspond to modulation-induced phase errors of +360 degrees and -360 degrees.

It should be emphasized that the term "comprises/comprising" when used in this specification is taken to specify the presence of stated features, integers, steps or

DETAILED DESCRIPTION OF THE PREFERRED EMBODIMENT

Figure 1:
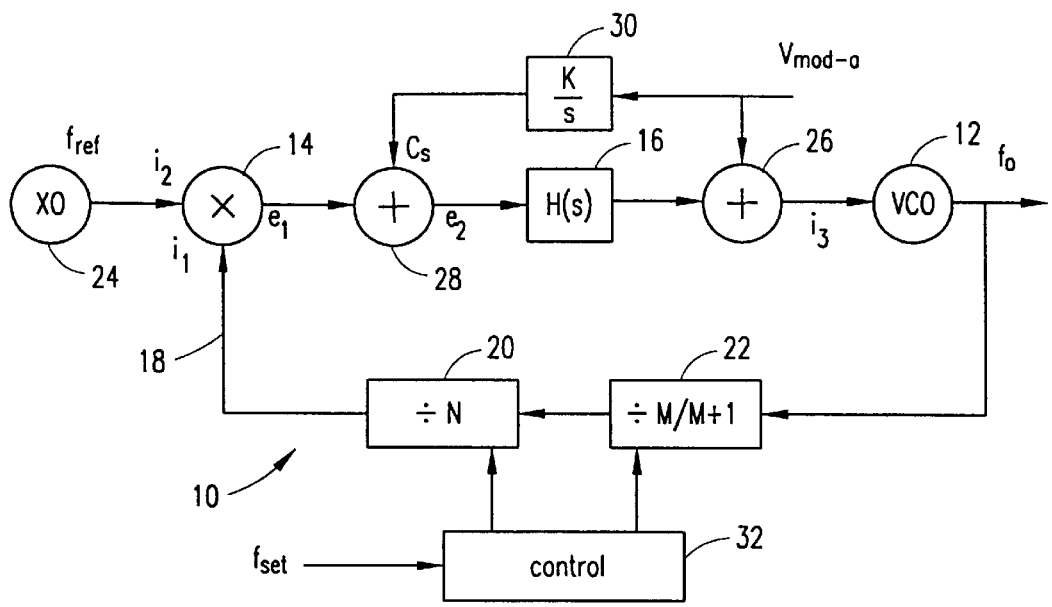
FIG. 1 is a block diagram showing a 2-point modulation arrangement for a PLL circuit of the prior art.

Referring to FIG. 1, there is shown a 2-point modulation PLL circuit 10 of a type known in the prior art. PLL 10 is provided with a VCO 12, a phase comparator 14, a loop filter 16 positioned therebetween, and a feedback path 18 which includes frequency dividers 20 and 22 receiving the VCO output signal $f_o$. The divided frequency signal provided by frequency dividers 20 and 22 is applied as an input signal $i_1$ to phase comparator 14, which also receives an input signal $i_2$, of reference frequency fref, from a crystal oscillator or other reference frequency source 24. Phase comparator 14 generates an output signal $e_1$, comprising the phase difference or phase error between signals $i_1$ and $i_2$.

To modulate VCO 12, an analog modulating signal $V_{mod-a}$ is applied to the VCO as an input or control signal $i_3$, through an adder 26 which also receives the output of loop filter 16. The loop filter 16 amplifies and filters the phase error received from comparator 14, and seeks to provide a VCO control signal $i_3$ such that the average phase error is minimized. The VCO acts like an ideal integrator 1/s. Thus, if modulating signal $V_{mod-a}$ was injected into the PLL at only a single point, the average phase error would be urged toward zero by the loop filter 16, thereby canceling any VCO frequency deviation and preventing frequency modulation of the VCO output signal.

Accordingly, FIG. 1 further shows a compensation signal $c_s$ also injected into PLL 10 by means of an adder 28, coupled between phase comparator 14 and loop filter 16. The compensation signal $c_s$ is generated by applying modulating signal $V_{mod-a}$ to a processing device 30, which acts as an ideal integrator 1/s and multiplies $V_{mod-a}$ by a constant K. The compensation signal $c_s$, added to the phase error signal $e_1$ by adder 28, comprises the loop filter 16 input $e_2$. The compensation signal effectively cancels the modulation signal component of phase error $e_1$, and thus prevents such component from counteracting modulation signal $V_{mod-a}$ applied to adder 26. However, the compensation signal may grow quite large if the frequency deviation has a mean which is not close to zero.

Referring further to FIG. 1, there is shown a frequency control device 32 coupled to selectively adjust each of the frequency dividers 20 and 22, in response to a divider control signal $f_{set}$. More particularly, control device 32 can adjust N of divider 20 to any integer over a range of integers, to divide VCO output signal $f_o$ by integer N. Control device 32 can also adjust M of divider 22 to any integer over a range of integers, to divide VCO output signal $f_o$ by a rational number M/M+1.

Figure 2:
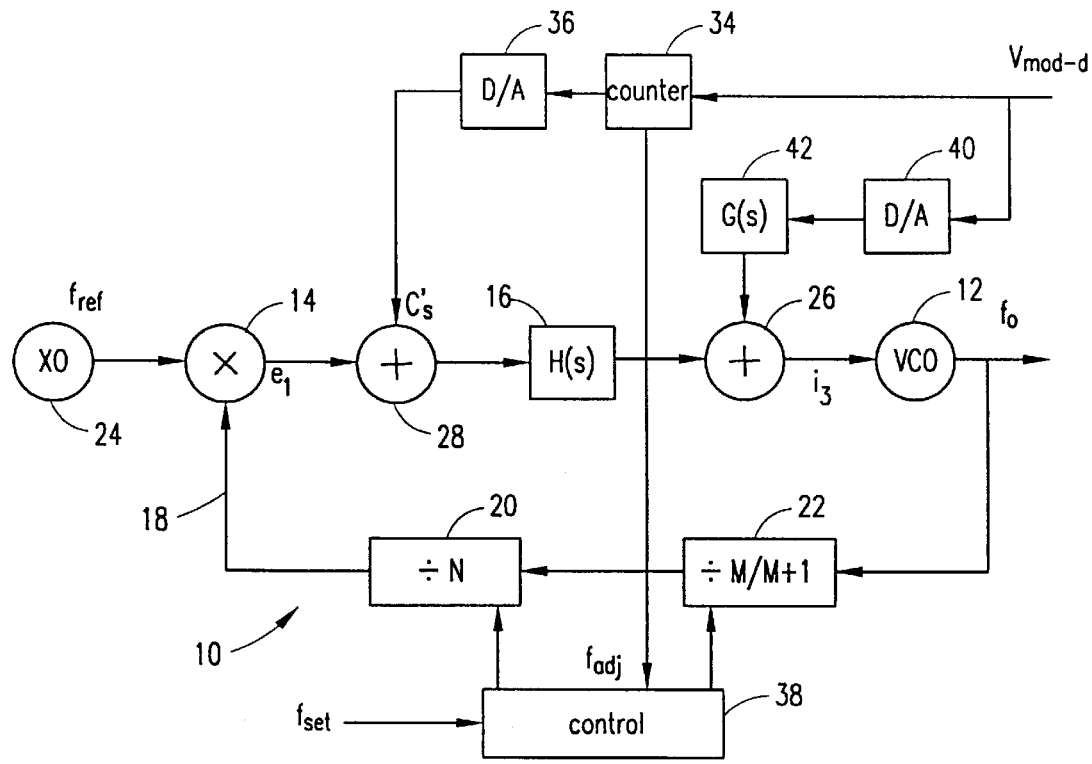
FIG. 2 is a block diagram showing an embodiment of the invention.

Referring to FIG. 2, there is shown an embodiment of the invention provided with a PLL circuit 10, which comprises the respective components described above in connection with FIG. 1. However, to achieve FM modulation of VCO output signal $f_o$, a digital sequence $V_{mod-d}$ is used as the modulation signal, rather than the analog modulation signal $V_{mod-a}$ of the prior art. Moreover, FIG. 2 shows the digital modulation signal coupled to an up-down counter 34 rather than to integration device 30. In accordance with the invention, it has been recognized that the digital sequence, or train of digital symbols, can be readily integrated by means of an updown counter or the like. The output of counter 34 is coupled to D/A converter 36 and converted to analog form thereby, to provide compensation signal $c'_s$. Compensation signal $c'_s$ is applied to adder 28, to inject the compensation signal into the PLL 10, and is thus added to the phase error signal $e_1$ as the modulation component. Accordingly, the modulation component of the error signal will be proportional to the output of counter 36.

Referring further to FIG. 2, there is shown a frequency divider control device 38, similar to control device 32 described above, which is disposed to adjust N and M of dividers 20 and 22, respectively, in response to signals fret. In addition, however, control device 38 is adapted to adjust the value of N of divider 20, in response to adjustment signals $f_{adj}$ coupled to control 38 from counter 34. More particularly, since the modulation component of the phase error signal is proportional to counter output, a divider adjustment signal $f_{adj}$ is generated when the digital modulation signal $V_{mod-d}$ drives counter 34 to an output value corresponding to a modulation induced phase error of 360 degrees. Counter 34 will generate one of two adjacent signals fade, depending on the sign of the 360 degree phase error. The two adjustment signals fadj respectively operate control device 38 to reset the frequency divider 20 from N to either N+1 or N−1, depending on the sign of the 360 degree error indicated by up-down counter 34.

Accordingly, when the digital modulation signal $V_{mod-d}$ induces a phase error of 360 degrees, or one full cycle, the divisor of frequency divider 20 is adjusted by one. The modulation induced error is thereby reset and the problem of phase wrapping is overcome. Up-down counter 34 is also reset, after generating a divider adjustment signal $f_{adj}$. Thus, by exploiting the modulus 360 degree properties of the phase error, it is possible to limit the signal levels in the modulation compensation circuit of the arrangement shown in FIG. 2.

The modulation signal $V_{mod-d}$ usefully originates from a binary signal of ones and zeros. Typically, the binary signal has been passed through a modulator (not shown) such as a QAM, PAM or the like, and through a digital filter (not shown) such as a FIR or an IIR filter. The digital filter introduces a pulse shape, and also shapes the spectrum of the signal $V_{mod-d}$ for transmission. It will be readily apparent that this signal must be converted to an analog signal before being induced or injected into the PLL. Accordingly, FIG. 2 further shows modulation signal $V_{mod-d}$ coupled to a D/A converter 40. The output of converter 40 is coupled through a G(s) filter 42 to adder 26 to provide VCO control signal $i_3$. Filter 42 comprises a linear time-invariant filter having a frequency response G(j2πf). Since D/A converter 40 is placed before filter 42, the filter 42 is an analog device, and may usefully serve as the reconstruction filter and the pulse-shaping filter for the modulation signal.

Figure 3:
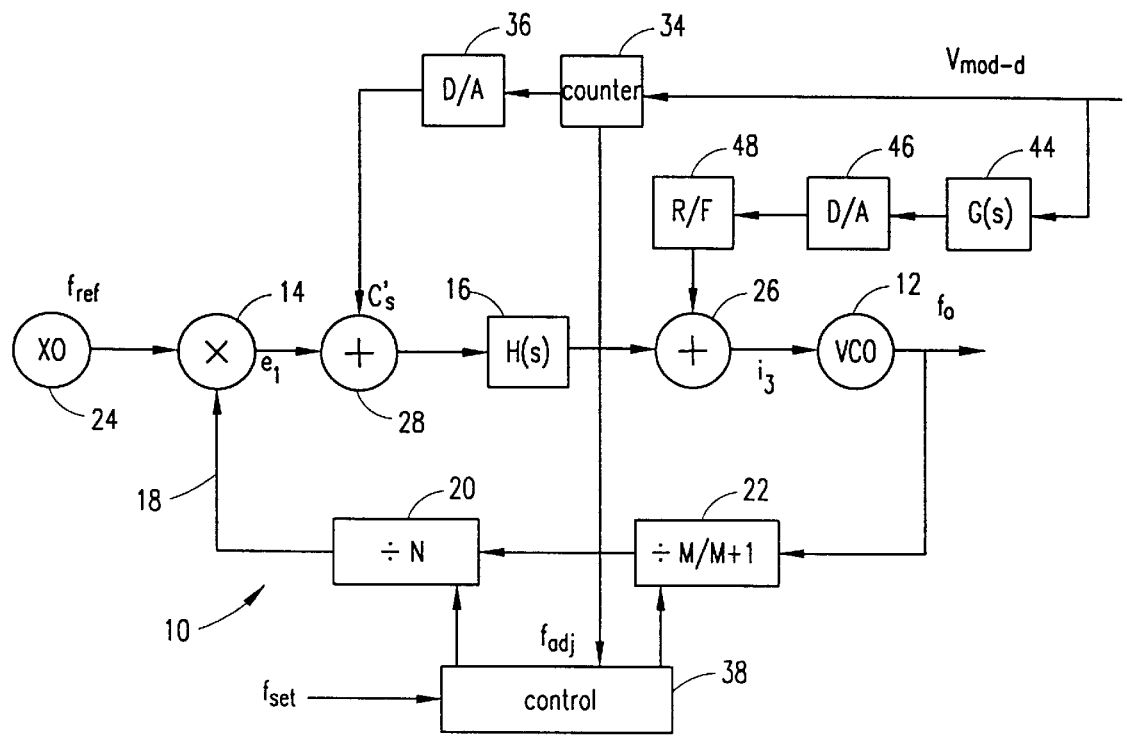
FIG. 3 is a block diagram showing a modification of the embodiment shown in FIG. 2.

Referring to FIG. 3, there is shown a second embodiment of the invention which is very similar to the embodiment shown in FIG. 2. However, the digital G(s) filter 44 is provided to directly receive modulation signal $V_{mod-d}$, unlike analog filter 42 of FIG. 2 which receives an analog signal. Accordingly, the G(s) filter 44 may apply pulse shaping to the modulation signal in the digital domain. The output of filter 44 is coupled to a D/A converter 46, and an analog reconstruction filter 48 is placed between converter 46 and adder 26 of the PLL 10.

In a modification of the invention, it is not necessary for the up-down counter 34 to count a 360 degree cycle of phase errors induced by the modulation signal. In such modification, a count which is equivalent to 360 degrees is added to or subtracted from a particular error, depending on the sign of the error. The particular error can then be represented by a counter output which only needs to be capable of representing any phase value over a range of 180 degrees. The resolution of D/A converter 36 may thereby be reduced by half.

Figure 4:
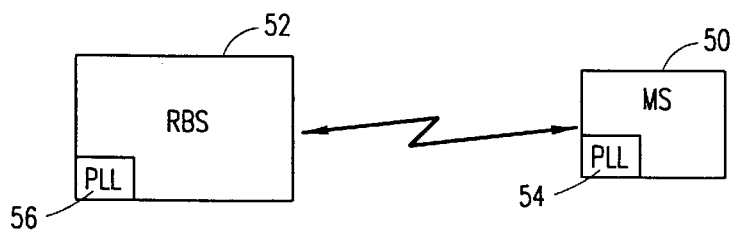
FIG. 4 is a block diagram showing an application of the PLL circuit in accordance with an embodiment of the invention.

Referring to FIG. 4, there is shown an important application of the PLL circuit of the invention, wherein such circuit is used as a radio receiver/transmitter component. More particularly, there is shown a mobile phone or mobile station 50 and a corresponding radio base station 52 which are respectively provided with frequency modulation devices 54 and 56 constructed in accordance with an embodiment of the invention, such as the embodiment described above in connection with FIG. 2. Mobile station 50 and radio base station 52 are representative components of a wireless telecommunications system such as a cellular system, a Wireless Local Area Network (WLAN) or a Personal Area Network (PAN). An example of a PAN is the Bluetooth Air Interface, which enables wireless communication over short ranges between devices such as mobile phones, portable PCs and laptop computers. It is anticipated that embodiments of the invention could also be usefully employed in radio devices such as pagers, electronic organizers, smart phones and Personal Digital Assistants.

Obviously, other modifications and variations of the present invention are possible in light of the above teachings. It is therefore to be understood that within the scope of the disclosed concept, the invention may be practiced otherwise than as specifically described.

What is claimed is:

1. In a PLL circuit comprising an adjustable frequency divider, a phase comparator, and a VCO disposed to provide an output signal of specified frequency, apparatus for selectively modulating said VCO output signal comprising:

a counter coupled to directly receive a digital modulation signal comprising a train of digital symbols, said counter being driven by said digital modulation signal to produce an output corresponding thereto, and to generate a divider adjustment signal each time said counter output reaches a specified value;

a first path for coupling a signal representing said digital modulation signal as an input to said VCO;

a second path for injecting a compensation signal into said PLL circuit;

a control device for adjusting said frequency divider to divide said VCO output signal by a selected divisor, said control device disposed to adjust said divisor by an increment of one in response to each said divider adjustment signal, and to additionally adjust said divisor in response to a divider control signal; and a third path for coupling each of said divider adjustment signals directly to said control device from said counter.

2. The apparatus of claim 1 wherein:

said counter comprises an up-down counter;

said counter generates first and second adjustment signals when said counter output reaches first and second values, respectively; and said first path includes a digital filter, coupled to directly receive said digital modulation signal, and a D/A converter.

3. The apparatus of claim 2 wherein:

said control device adjusts the divisor of said frequency divider from N to N+1 and from N to N-1, in response to said first and second adjustment signals, respectively.

4. The apparatus of claim 3 wherein:

said first and second values correspond to modulation-induced phase errors of +360 degrees and -360 degrees, respectively.

5. The apparatus of claim 1 wherein:

said digital modulation signal coupled to said counter comprises a frequency modulation signal.

6. The apparatus of claim 5, wherein:

said first path includes a filtering device and a first D/A converter.

7. The apparatus of claim 6:

said second path includes a second D/A converter coupled to receive said counter output, said second D/A converter having an output which comprises said compensation signal.

8. The apparatus of claim 7, wherein:

said compensation signal is coupled to an adder and combined with an output of said phase comparator, said adder having an output which is coupled to a loop filter.

9. The apparatus of claim 8 wherein:

said signal representing said modulation signal is combined with an output of said loop filter to provide a control signal coupled to said VCO input.

10. the apparatus of claim 9 wherein:

said VCO output signal has a frequency functionally related to a reference frequency signal coupled as an input to said comparator.

11. The apparatus of claim 1 wherein:

said counter is disposed to provide an output which is limited to representing phase values over a range of 180 degrees.

12. The apparatus of claim 1 wherein:

said apparatus is incorporated into a selected radio receiver/transmitter component for a wireless telecommunications system.

13. The apparatus of claim 12 wherein:

said telecommunications system comprises a WLAN.

14. The apparatus of claim 12 wherein:

said telecommunications system comprises a PAN.

15. In a PLL circuit comprising an adjustable frequency divider, a phase comparator, and a VCO disposed to provide an output signal of specified frequency, a method comprising the steps of:

receiving a digital modulation signal comprising a train of digital symbols at a location proximate to said PLL circuit;

coupling said digital modulation signal to a counter to drive said counter to generate a divider adjustment signal having a corresponding relationship to said digital modulation signal;

resetting said counter after generating said divider adjustment signal;

coupling said divider adjustment signal to said frequency divider to adjust the divisor of said frequency divider by an increment of one; and coupling a divider control signal to said frequency divider to perform an adjustment of said divisor in addition to any adjustment made by any of said divider adjustment signals.

16. The method of claim 15 wherein said method further comprises the steps of:

coupling a signal representing said digital modulation signal as an input to said VCO; and injecting a compensation signal into said PLL circuit.

17. The method of claim 16 wherein:

said digital modulation signal is coupled to drive an up-down counter located proximate to said PLL circuit to produce a counter output, and to thereby generate said divider adjustment signal.

18. The method of claim 17 wherein:

first and second adjustment signals are generated and coupled to said frequency divider when said counter output reaches first and second values, respectively.

19. The method of claim 18 wherein:

said control device is adjusted to vary the divisor of said frequency divider from N to N+1 and from N to N−1, in response to said first and second adjustment signals, respectively.

20. The method of claim 19 wherein:

said first and second values correspond to modulation-induced phase errors of +360 degrees and −360 degrees, respectively.

21. The method of claim 17 wherein:

said counter is disposed to provide an output which is limited to representing phase values over a range of 180 degrees.

22. The method of claim 15 wherein:

said received digital modulation signal comprises a frequency modulation signal.

23. The method of claim 15 wherein:

said VCO output signal has a frequency functionally related to a reference frequency signal coupled as an input to said comparator.

24. The method of claim 15 wherein:

said PLL circuit is incorporated into a selected radio receiver/transmitter component for a wireless telecommunications system.

25. The method of claim 24 wherein:

said telecommunications system comprises a WLAN.

26. The method of claim 24 wherein:

said telecommunications system comprises a PAN.

* * * * *